US011223006B2

(12) United States Patent
Zelka (10) Patent No.: US 11,223,006 B2
(45) Date of Patent: Jan. 11, 2022

(54) MECHANISMS FOR PRE-STRETCHING ELECTRO-ACTIVE POLYMERS BY A PRE-DETERMINED AMOUNT AND METHODS OF USE THEREOF

(71) Applicant: ElastiMed Ltd., IP Tradyon (IL)

(72) Inventor: Omer Zelka, Kfar-Saba (IL)

(73) Assignee: ElastiMed Ltd., Yokneam Ilit (IL)

( * ) Notice: Subject to any disclaimer, the term of this patent is extended or adjusted under 35 U.S.C. 154(b) by 800 days.

(21) Appl. No.: 16/045,106

(22) Filed: Jul. 25, 2018

(65) Prior Publication Data

US 2019/0044052 A1 Feb. 7, 2019

Related U.S. Application Data

(60) Provisional application No. 62/540,014, filed on Aug. 1, 2017.

(51) Int. Cl.
| | |
|---|---|
| *H01L 41/08* | (2006.01) |
| *H01L 41/083* | (2006.01) |
| *H01L 41/253* | (2013.01) |
| *H01L 41/193* | (2006.01) |

(52) U.S. Cl.
CPC ........ *H01L 41/0836* (2013.01); *H01L 41/193* (2013.01); *H01L 41/253* (2013.01)

(58) Field of Classification Search
CPC .......................... H01L 41/193; H01L 41/0836
See application file for complete search history.

(56) References Cited

U.S. PATENT DOCUMENTS

| | | | | |
|---|---|---|---|---|
| 2007/0116858 A1* | 5/2007 | Benslimane | ........... | H02N 1/006 427/58 |
| 2007/0265140 A1* | 11/2007 | Kim | ................. | A63B 21/00181 482/8 |
| 2008/0195018 A1* | 8/2008 | Larson | ..................... | A61H 7/00 602/53 |
| 2010/0275338 A1* | 11/2010 | Hyde | .................. | A61B 5/6804 2/69 |
| 2016/0184141 A1* | 6/2016 | Zelka | ..................... | B32B 27/08 606/201 |
| 2018/0271409 A1* | 9/2018 | Gong | ........................ | G01B 7/16 |
| 2021/0068752 A1* | 3/2021 | Susteric | ............... | A61B 5/0015 |

* cited by examiner

*Primary Examiner* — Jaydi San Martin
(74) *Attorney, Agent, or Firm* — Greenberg Traurig, LLP (57) ABSTRACT

In some embodiments, the present invention is directed to an exemplary inventive method having steps of: providing at least one housing having a pre-determined physical structure; fixing a first edge of at least one electro-active polymer (EAP) film within the at least one housing; connecting a first edge of at least one pulling mechanism to a second edge of the at least one EAP film; where a second edge of the at least one pulling mechanism extends outside of the at least one housing; sufficiently pulling at the second edge of the at least one pulling mechanism to form at least one pre-stretched EAP film that has been stretched in a first axial direction within the at least one housing by a first pre-determined, pre-stretched amount; and where the pre-determined, pre-stretched amount is limited by the pre-determined physical structure of the housing.

24 Claims, 12 Drawing Sheets

MECHANISMS FOR PRE-STRETCHING ELECTRO-ACTIVE POLYMERS BY A PRE-DETERMINED AMOUNT AND METHODS OF USE THEREOF

TECHNICAL FIELD

In some embodiments, the present invention relates to methods and mechanisms thereof for pre-stretching electro-active polymer films by a pre-determined amount, and methods of use thereof.

BACKGROUND

Typically, electro-active polymers are polymers that exhibit a change in size or shape when stimulated by an electric field.

BRIEF SUMMARY

In some embodiments, the present invention is directed to an exemplary inventive method that at least includes steps of: providing at least one housing having a pre-determined physical structure; fixing a first edge of at least one electro-active polymer (EAP) film within the at least one housing; connecting a first edge of at least one pulling mechanism to a second edge of the at least one EAP film; where the first edge and the second edge of the at least one EAP film are opposite of each other; where a second edge of the at least one pulling mechanism extends outside of the at least one housing; sufficiently pulling at the second edge of the at least one pulling mechanism to form at least one pre-stretched EAP film that has been stretched in a first axial direction within the at least one housing by a first pre-determined, pre-stretched amount; and where the pre-determined, pre-stretched amount is limited by the pre-determined physical structure of the housing.

In some embodiments, the exemplary inventive method may further include utilizing at least one first attachment mechanism to fix the first edge of the at least one EAP film to a first edge of the at least one housing; and utilizing at least one second attachment mechanism to fix the second edge of the at least one EAP film to the at least one pulling mechanism.

In some embodiments, the at least one first attachment mechanism and the at least one second attachment mechanism are clips.

In some embodiments, the at least one housing is a flexible sleeve.

In some embodiments, the exemplary inventive method may further include wrapping the at least one housing with the at least one pre-stretched EAP film around a solid body, and securing the at least one housing on the solid body.

In some embodiments, the solid body is at least a portion of a part of a human or animal body.

In some embodiments, the exemplary inventive method may further include securing of the flexible sleeve on the solid body by connecting the at least one second attachment mechanism to at least one of: the at least one first attachment mechanism or the at least one housing.

In some embodiments, the wrapping the flexible sleeve with the at least one pre-stretched EAP film around the solid body is configured to apply a particular pressure to the solid body.

In some embodiments, the exemplary inventive method may further include activating the at least one pre-stretched EAP film to reduce the particular pressure on the solid body to a particular reduced pressure.

In some embodiments, the exemplary inventive method may further include deactivating the at least one pre-stretched EAP film to raise the particular reduced pressure.

In some embodiments, a X number of pre-stretched EAP films are associated with one or more housings, where X is between 1 and 10,000.

In some embodiments, the exemplary inventive method may further include subjecting, during a particular time period, one or more first EAP films to at least one condition selected from: i) activation or ii) deactivation; and subjecting, during the particular time period, one or more second EAP films to the at least one condition; and where the subjecting the one or more first EAP films to the at least one condition and the subjecting the one or more second EAP films to the at least one condition are performed with respect to each other i) sequentially or ii) intermittently.

In some embodiments, the exemplary inventive method may further include connecting a first edge of at least one second pulling mechanism to a third edge of the at least one EAP film; where the first edge, the second edge, and the third edge of the at least one EAP film are distinct edges; where a second edge of the at least one second pulling mechanism extends outside of the at least one housing; sufficiently pulling at the second edge of the at least one second pulling mechanism to stretch the at least one EAP film in a second axial direction within the at least one housing by a second pre-determined, pre-stretched amount to form at least one biaxially pre-stretched EAP film; where the second pre-determined, pre-stretched amount is also limited by the pre-determined physical structure of the housing.

In some embodiments, the present invention is directed to an exemplary active compression device that may include at least the following components of: at least one housing having a pre-determined physical structure; at least one electro-active polymer (EAP) film having a first edge that is fixed within the at least one housing; at least one pulling mechanism that is connected to a first edge of to a second edge of the at least one EAP film; where the first edge and the second edge of the at least one EAP film are opposite of each other; where a second edge of the at least one pulling mechanism extends outside of the at least one housing; where the the at least one pulling mechanism is configured to allow sufficient pulling at the second edge of the at least one pulling mechanism to form at least one pre-stretched EAP film that has been stretched in a first axial direction within the at least one housing by a first pre-determined, pre-stretched amount; and where the pre-determined, pre-stretched amount is limited by the pre-determined physical structure of the housing.

BRIEF DESCRIPTION OF THE DRAWINGS

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

DETAILED DESCRIPTION

Reference will now be made to several embodiments of the present invention(s), examples of which are illustrated in the accompanying figures. Wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein. The terms, "for example", "e.g.", "optionally", as used herein, are intended to be used to introduce non-limiting examples.

The phrases "in one embodiment" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments of the invention may be readily combined, without departing from the scope or spirit of the invention.

The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Throughout this description the term "Electro-Active Polymer," "electro-active polymer" or "EAP" is used to indicate dielectric elastomer film(s) adapted to be stretched biaxially or in a single axis. The use of the term "EAP" is a general descriptive of a genus and should not be limited to any particular shape, construction material and/or geometry, and at least some embodiments of the present invention cover are directed to all suitable elastic materials, such as the 3M™ VHB™ 4910, 4905, 4955, 4959 or 9460 Tape, the Hi-Bond VST4050 Tape, Dow Corning™ or Nusil™ silicon elastomer, Elastosil or Silpuran film by Wacker, or any other suitable silicon or acrylic dielectric elastomer.

As used herein, a "conductor" refers to an object or type of material that allows the flow of electrical current in one or more directions.

In some embodiments, the present invention is directed to a method that at least includes the following steps of
  a) manually pre-stretching an electro-active polymer film in a single or biaxial directions;
  b) mechanically limiting said pre-stretched by a pre-determined amount; and
  c) fixing the electro-active polymer film in the pre-determined, pre-stretched state.

In some embodiments, manually pre-stretching the EAP film is made by pulling the film in a certain direction. In some embodiments, in order to fix the electro-active polymer film in pre-stretched state on a single axis, the EAP film is wrapped around a solid body. In some embodiments, the electro-active polymer is folded. In some embodiment, the EAP film is coated by a stretchable conductor. In some embodiments, each conducting layer is printed or etched to the electro-active polymer.

In some embodiments, manually pre-stretching the electro-active polymer film, is made by pulling the film. In some embodiments, the EAP film might be held by clips at its edges. In some embodiments, pulling the EAP film might be performed by pulling one of the clips. In some embodiments, limiting the motion of the clip by using a barrier, limits the pre-stretched of the EAP film by a pre-determined amount. In some embodiments, an example of such barrier, is a sleeve-type housing with sewn edges (e.g. placing an EAP film in the sleeve and limiting the movement of the clip by a sewn edge). In some embodiment, fixing the clips in place, holds the EAP film in a pre-determined pre-stretched state. In some embodiments, fixing the clips in place is made by wrapping the EAP film around a solid body, and connecting one clip to a second clip. In some embodiments, the solid body is a human or animal body part. In some embodiment, connecting clips is done via a mechanical connector, for example but not limited to: Velcro, buckle, lock or any other type of mechanical connector. In some embodiments the sleeve might be made of fabric or any other suitable material.

In some embodiment, wrapping the EAP film around solid body, applies sufficient pressure to the solid body. In some embodiment, activating the EAP film, reduces the pressure which is applied on the solid body by sufficiently relaxing the EAP film. In some embodiment, deactivating the EAP film, raises the pressure which is applied on the solid body by stretching the EAP film. In some embodiment, the inventive EAP film of the present invention can be used as a compression device. In some embodiments, a Y number of EAP films within one or more predetermined housings (e.g., flexible sleeves) can wrapped around the solid body, wherein Y is between 1 and 10,000. In some embodiment, the EAP films can be wrapped in parallel along the solid body. In some embodiment, activating the EAP films simultaneously can be used to apply intermittent compression. In some embodiment, activating the EAP films sequentially can be used to apply sequential compression. In some embodiment, X is the time required to raise or reduce the pressure applied by an EAP film, by deactivating or activating the EAP film, wherein X is between 0.01 seconds and 100 seconds. In some embodiment, when applying intermittent compression using the EAP film, the pressure is kept sufficient for X amount of time, wherein X is between 0.01 seconds and 1 hour. In some embodiment, when applying intermittent compression using the EAP film, the pressure is kept low for X amount of time, wherein X is between 0.01 seconds and 1 hour. In some embodiment, when applying sequential compression using the EAP film, the pressure is kept high for X amount of time, wherein X is between 0.01 seconds and 1 hour. In some embodiment, when applying sequential compression using the EAP film, the pressure is kept low for X amount of time, wherein X is between 0.01 seconds and 1 hour. In some embodiment, when applying sequential compression, the time difference between activating on EAP film and a different EAP film is X, wherein X is between 0.01 seconds and 100 seconds.

In some embodiment, while the EAP film is applying high pressure, the pressure is between 6 mmHg and 1000 mmHg. In some embodiment, while the EAP film is applying low pressure, the pressure is between 5 mmHg and 999 mmHg.

In some embodiments, the present invention provides a method for keeping the electro-active polymer film in a pre-stretched state/condition on a single axis, by wrapping and fixing it around a solid body, e.g. a human body part.

In some embodiments, the electroactive polymer film is folded Z times prior to it being pre-stretched, wherein Z is between 1 and 10,000.

In some embodiments, the EAP film is coated by a stretchable conductor. In some embodiment, said conductor might be a stretchable conductor, for example but not limited by, carbon or silver based conducting ink, Polyaniline (PAni) based solution, carbon based solution, carbon black powder, conducting polymer, conductive rubber, conductive silver or carbon paste, conductive epoxy, conducting grease, laser cut or molded rigid conducting sheet in an expanding pattern, graphite powder based solution, stretchable conducting sheet made by networks of gold and/or carbon nano-particles embedded in elastic polyurethane or any combination thereof. In some embodiment, said conductor might be attached to the EAP film by, for example but not limited to, printing, etching, brushing, water dispersion, gluing and/or any other similarly suitable method(s) of attachment or any combination thereof. In some embodiments, the stretchable conductor is made from carbon black powder. In some embodiments, the stretchable conductor is made from a conductive polymer. In some embodiments, the stretchable conductor is made from conductive rubber. In some embodiments, the expanding pattern is one of a zigzag pattern, and expanding diamond pattern. In some embodiments, an exemplary conductor is in a form of a semi-stiff conductor made, for example but not limited to, by a conducting ink (e.g., silver and/or carbon based conductive ink, for example, 125-10 silver-based or 112-48 carbon-based electrically conductive inks made by Creative Materials, Inc. (Massachusetts, US), or Creative Materials, Inc. In some embodiments, the exemplary conductor is in a form of a stretchable conductor, such as, for example, a stretchable electrical conductor that is created out of networks of gold and/or carbon nano-particles embedded in elastic polyurethane. In some embodiments, the exemplary conductor is made from a carbon black powder layer attached to the electro-active polymer, for example but not limited to, Ketjenblack EC-600JD powder by Akzo Nobel (Amsterdam, Netherlands), C-Nergy™ Super C 65 made by Imerys Graphite & Carbon (Bironico, Switzerland), or 250P made by Ensaco (Timcal, Cleveland, Ohio). In some embodiments, the exemplary conductor is made from carbon or silver paste, for example, but not limited to, WIK20489-56A by Henkel (Düsseldorf, Germany). In some embodiments, the exemplary conductor is made from carbon or silver conductive epoxy, for example, but not limited to, H20E by Epo-Teck (Billerica, Mass.). In some embodiments, the exemplary conductor is made by Polyaniline (PAni) based solution, carbon based solution, a laser cut or molded rigid conducting sheet, or any combination thereof.

The term "pre-stretch," and its variants are being used herein to describe mechanically stretching of an electro-active polymer film in a single axis or biaxial planar direction prior to activation. In some embodiments, by maintaining the EAP in the pre-stretched state/condition, the instant invention allows to at least:

i) increase the electrical breakdown strength,
ii) minimize or eliminate pull-in instability; and/or
iii) decrease the EAP film's thickness, thus lower the voltages required for activation.

In some embodiments, the term "pre-stretch" is referred to any mechanical stretch from 10%-5000% of the electro-active polymer film original size. In some embodiments, the "pre-stretch" is referred to any mechanical stretch from 10%-100% of the electro-active polymer film original size. In some embodiments, the term "pre-stretch" is referred to any mechanical stretch from 50%-100% of the electro-active polymer film original size. In some embodiments, the term "pre-stretch" is referred to any mechanical stretch from 50%-1000% of the electro-active polymer film original size. In some embodiments, the term "pre-stretch" is referred to any mechanical stretch from 100%-5000% of the electro-active polymer film original size. In some embodiments, the term "pre-stretch" is referred to any mechanical stretch from 1000%-5000% of the electro-active polymer film original size. In some embodiments, the term "pre-stretch" is referred to any mechanical stretch from 2500%-5000% of the electro-active polymer film original size.

In some embodiments, the exemplary method of the present invention further includes using more than one layer and up to 1,000 layers of electro-active polymer films to improve strength and/or durability of the EAP film. In some embodiments, the exemplary method of the present invention further includes using more than one layer and up to 100 layers of electro-active polymer films in order to improve strength and/or durability of the EAP film.

In some embodiments, multi-layered structure(s) of electro-active polymer films of the present invention is/are made by, for example but not limited to, folding a single film, attaching multiple films to each other, and/or any combination thereof.

In some embodiments, the exemplary conductor utilized in accordance with the present invention is selected from the group consisting of a stretchable conductor, a rigid conductor in an expanding pattern, a printed conductor in an expanding pattern, and any combination thereof.

In some embodiments, the exemplary stretchable conductor utilized in accordance with the present invention can be created out of networks of gold and/or carbon nano-particles embedded in elastic polyurethane, or any other suitable stretchable conductor.

In some embodiments, the exemplary stretchable conductor utilized in accordance with the present invention can be created by a layer of carbon black powder glued to the electro-active polymer or any other suitable stretchable conductor.

In some embodiments, the exemplary stretchable conductor utilized in accordance with the present invention can be created by a conducting polymer or any other suitable stretchable conductor.

In some embodiments, the exemplary stretchable conductor utilized in accordance with the present invention can be created by a conducting rubber or any other suitable stretchable conductor.

In some embodiments, the exemplary stretchable conductor utilized in accordance with the present invention can be created by applying a carbon or silver paste or any other suitable stretchable conductor.

In some embodiments, the exemplary stretchable conductor utilized in accordance with the present invention can be created by applying a carbon or silver epoxy or any other suitable stretchable conductor.

In some embodiments, the exemplary conductor utilized in accordance with the present invention can be created by laser cutting, molding and/or etching a solid conductor. In some embodiments, the exemplary printed conductor utilized in accordance with the present can be a made utilizing a conducting ink based on silver and/or carbon.

In some embodiments, an exemplary expanding pattern utilized in accordance with the present invention refers to one of a zigzag pattern, an expanding diamond pattern or any other suitable expanding pattern.

In some embodiments, the attachment of an exemplary conductor to an electro-active polymer is done by printing, etching, brushing, water dispersion, gluing, ion-attachment and/or any other suitable method of the attachment.

In some embodiments, an exemplary EAP film can be activated by applying an electric charge on the conducting layers attached to the electro-active polymer film, thus creating an electric field which expands the electro-active polymer film in a single axis or biaxial direction. In some embodiments, the activation creates an expansion of the exemplary EAP film by 3%-100% in a single axis or biaxial directions from its original size. In some embodiments, the activation creates an expansion of the exemplary EAP film by 3%-500% in a single axis or biaxial directions from its original size. In some embodiments, the activation creates an expansion of the exemplary EAP film by 3%-1000% in a single axis or biaxial directions from its original size. In some embodiments, the activation creates an expansion of the exemplary EAP film by 50%-1000% in a single axis or biaxial directions from its original size. In some embodiments, the activation creates an expansion of the exemplary EAP film by 100%-1000% in a single axis or biaxial directions from its original size. In some embodiments, the activation creates an expansion of the exemplary EAP film by 500%-1000% in a single axis or biaxial directions from its original size.

In some embodiments, variables that affect the expansion and the direction of the expansion include, but are not limited to:
i) an amount and/or a direction of the pre-stretch;
ii) an electrical charge being applied (e.g., between 10V-20,000V, between 100V-20,000V, between 1000V-20,000V, between 10V-1,000V, between 10V-10,000V, between 10,000V-20,000V);
iii) a method and/or a type of fixation/attachment; and
iv) any combination thereof.

In some embodiments, the electro-active polymer film layer has thickness between 10 um-5 mm. In some embodiments, the electro-active polymer film layer has thickness between 100 um-5 mm. In some embodiments, the electro-active polymer film layer has thickness between 1000 um-5 mm. In some embodiments, the electro-active polymer film layer has thickness between 10 um-1 mm. In some embodiments, the electro-active polymer film layer has thickness between 100 um-1 mm. In some embodiments, the electro-active polymer film layer has thickness between 500 um-1 mm.

In some embodiments, each conducting layer is attached to the electro-active polymer layer by, for example but not limited to, at least one of printing (e.g., utilizing conductive ink), etching (e.g., using a solution of electrolyte), brushing (e.g., using carbon graphite powder with silicon oil), water dispersion (e.g., using PAni based solution), gluing (e.g., gluing a laser cut or molded into an expanding pattern such as zigzag, rigid conducting sheet), and any other suitable applicable method(s).

In some embodiments, electro-active polymers that are pre-stretched improve conversion between electrical and mechanical energy. In some embodiments, the pre-stretched state/condition stabilizes the actuation of the electro-active polymer due to at least one of:
i) minimizing or eliminating the pull-in instability by generating electrostriction;
ii) increasing the breakdown strength, see Appendix A. 3; and/or
iii) reducing the films thickness, which consequently lowers the voltages required for activation.

In some embodiments, reducing the films thickness is by stretching the material.

For example, the pull-in instability identifies a state, when voltage is applied on an electro-active polymer film, causing the film to thin down—e.g., voltage produces a higher electric field, which squeezes the electro-active polymer film as a positive feedback until an electrical breakdown In some embodiments, the voltage required to activate, for example, 3M's VHB 4910 film is 50 KV per 1 mm. Pre-stretching the film biaxially by 10% reduces the film thickness to 0.1 mm and the activation voltage to 5 KV. In some embodiments, the inventive pre-stretched acrylic copolymer elastomers (e.g., 3M VHB 4910 or VHB 4905 by 3M Corporation) produce a stable comparatively high and reversible electromechanical stretch of 3% to 1000% in area of the linear stretch.

Figure 1:
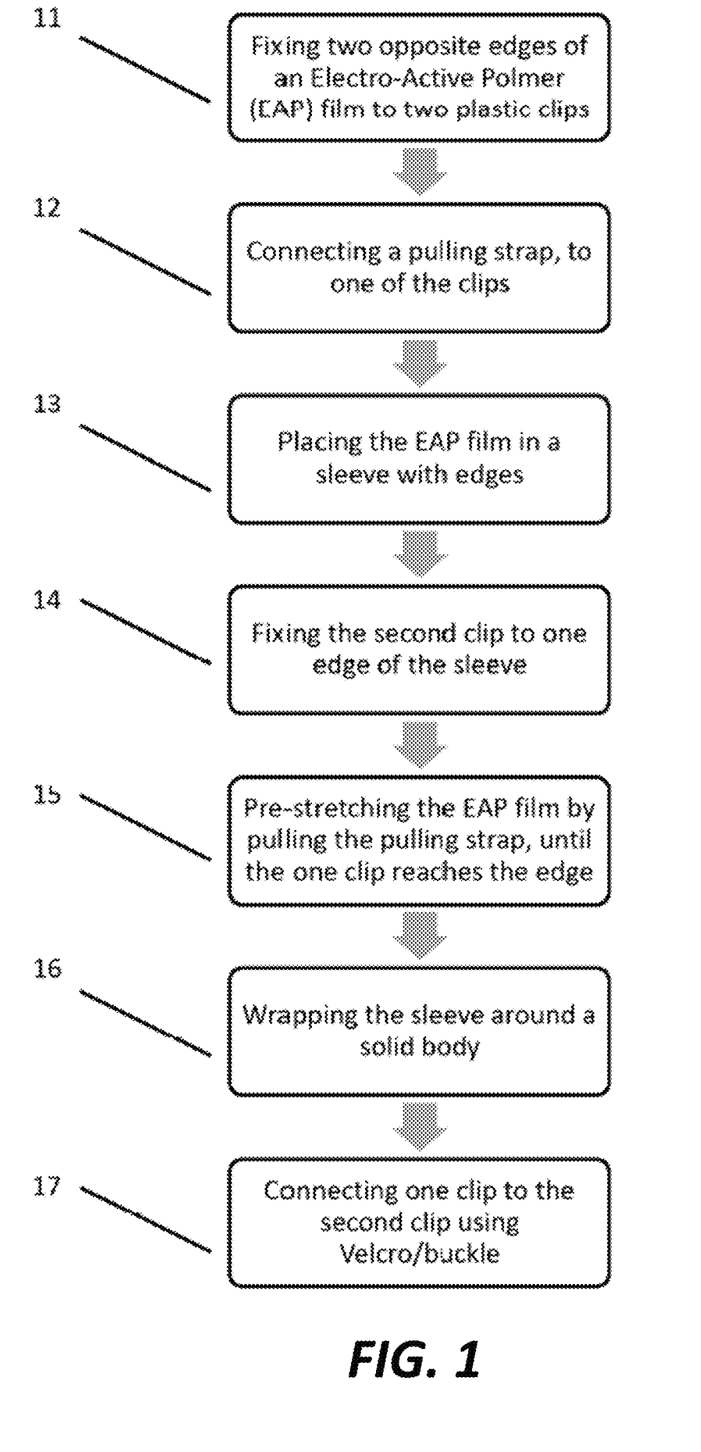
FIG. 1 is a flow chart generally illustrating an exemplary procedure for manually pre-stretching an electro-active polymer film and holding it in a pre-stretched state, according to some embodiments of the present invention.

FIG. 1 is a flow chart generally illustrating an exemplary procedure for manually pre-stretching an electro-active polymer film and holding it in a pre-stretched state, according to some embodiments of the present invention. In some embodiments, this procedure can include at least the steps of:
1) fixing two opposite edges of the EAP film to two rigid clips;
2) connecting a pulling strap to one of the clips, which is generally indicated as item 23 in FIG. 2A;
3) placing the EAP film in a sleeve with sewn edges, which is generally indicated as item 21 in FIG. 2A;
4) fixing the second clip to one edge of the sleeve;
5) pre-stretching the EAP film by pulling the pulling strap, until the one clip reaches the sewn edge, which is generally indicated in FIGS. 2A-2C;
6) wrapping the sleeve around a solid body; and
7) connecting one clip to the second clip or to the one edge of the sleeve using a buckle or Velcro or any other method of attachment, which is generally indicated in FIG. 4.

Figure 2A:
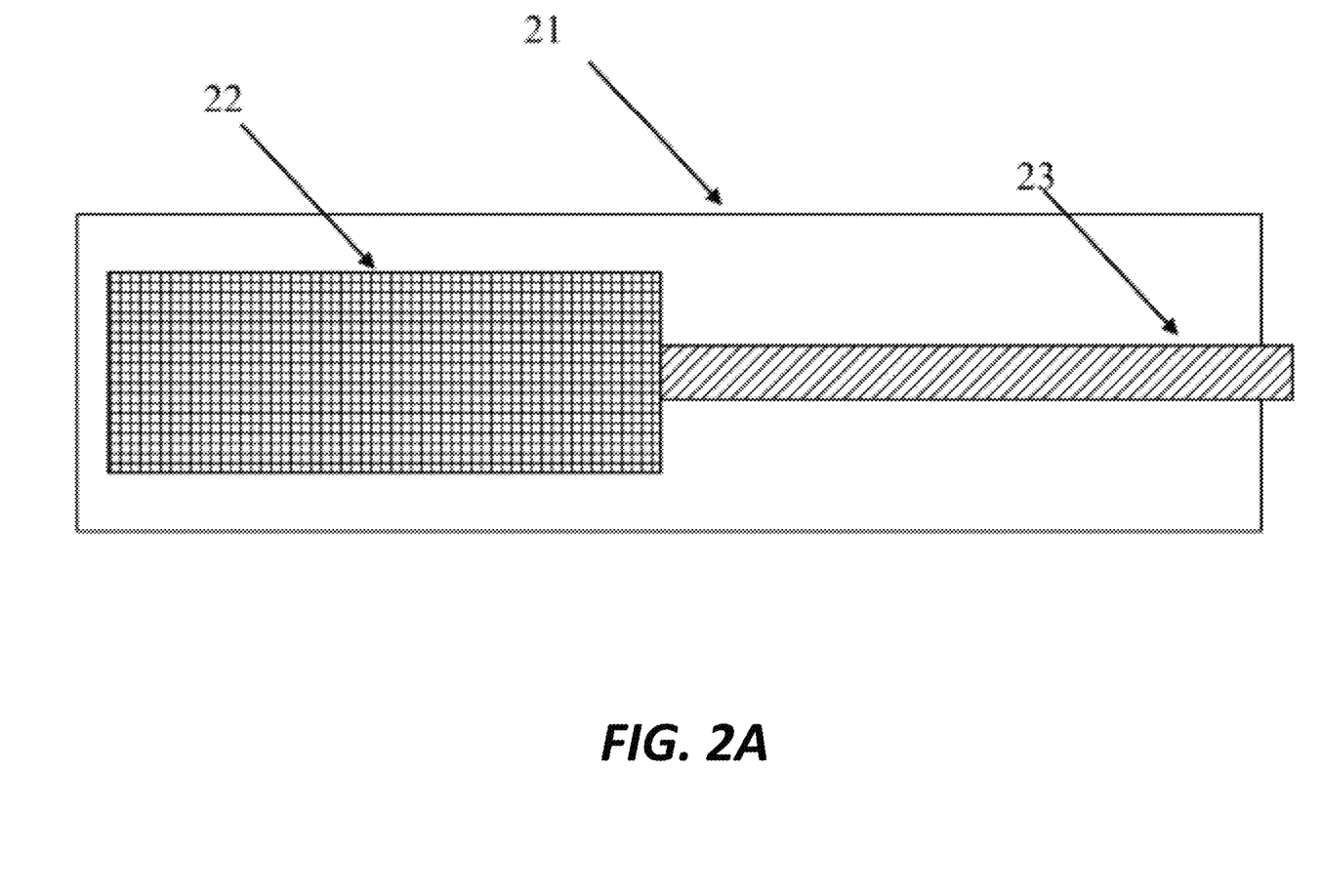
FIGS. 2A, 2B and 2C schematically illustrate an exemplary method of using a mechanical limitation for pre-stretching an electro-active polymer by a pre-determined amount in a single axis.
Figure 2B:
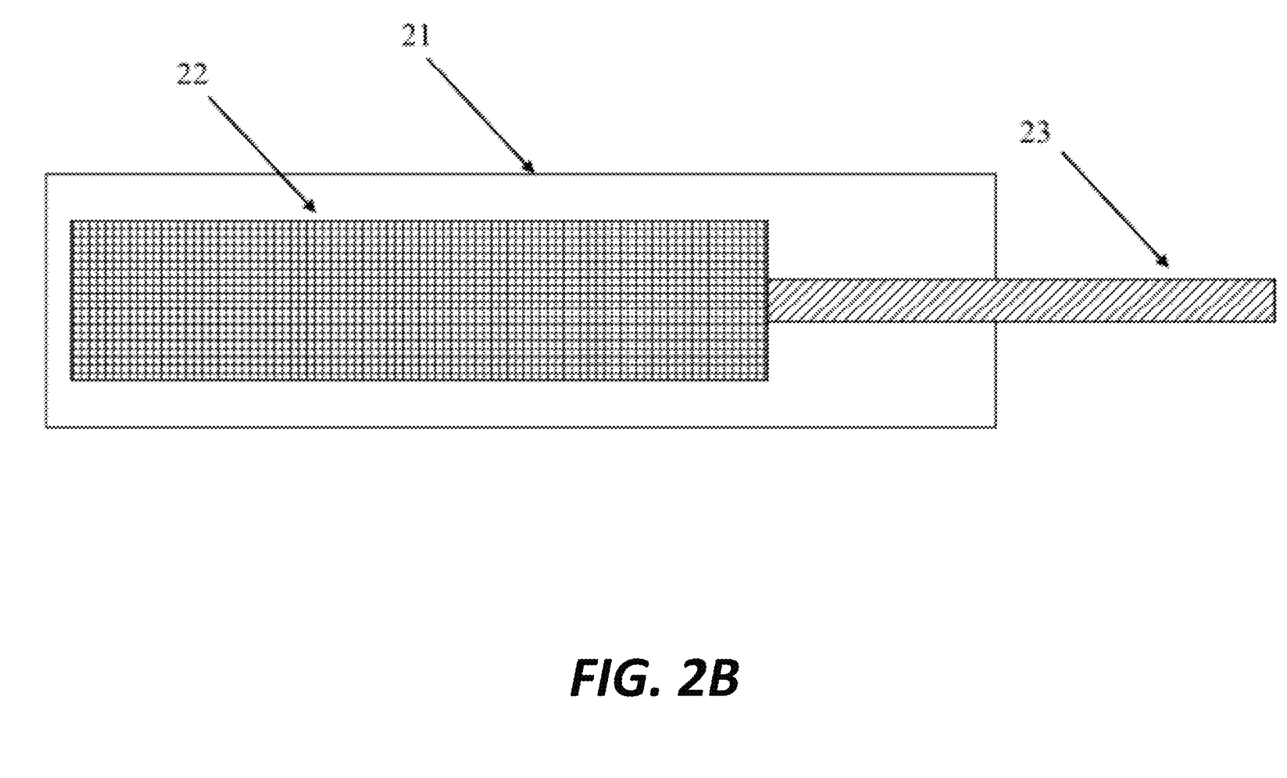
Figure 2C:
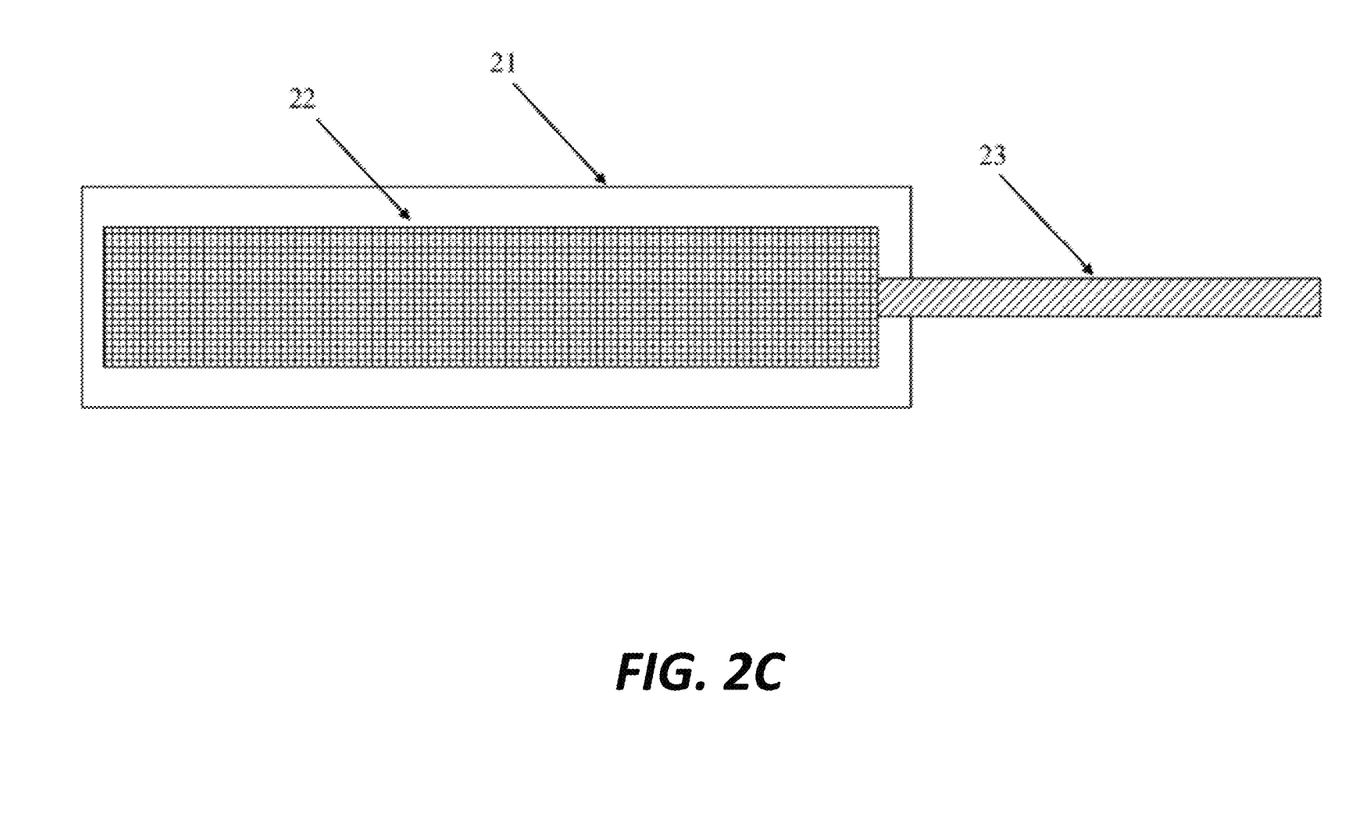

FIGS. 2A, 2B and 2C schematically illustrate an exemplary method of using a mechanical limitation for pre-stretching an electro-active polymer film by a pre-determined amount in a single axis. As FIG. 2A shows, the EAP film 22, is connected to a pulling strap 23 and is held within a sleeve 21. Pulling the pulling strap 23 stretches the EAP film 22, as shown in FIGS. 2B and 2C.

Figure 3A:
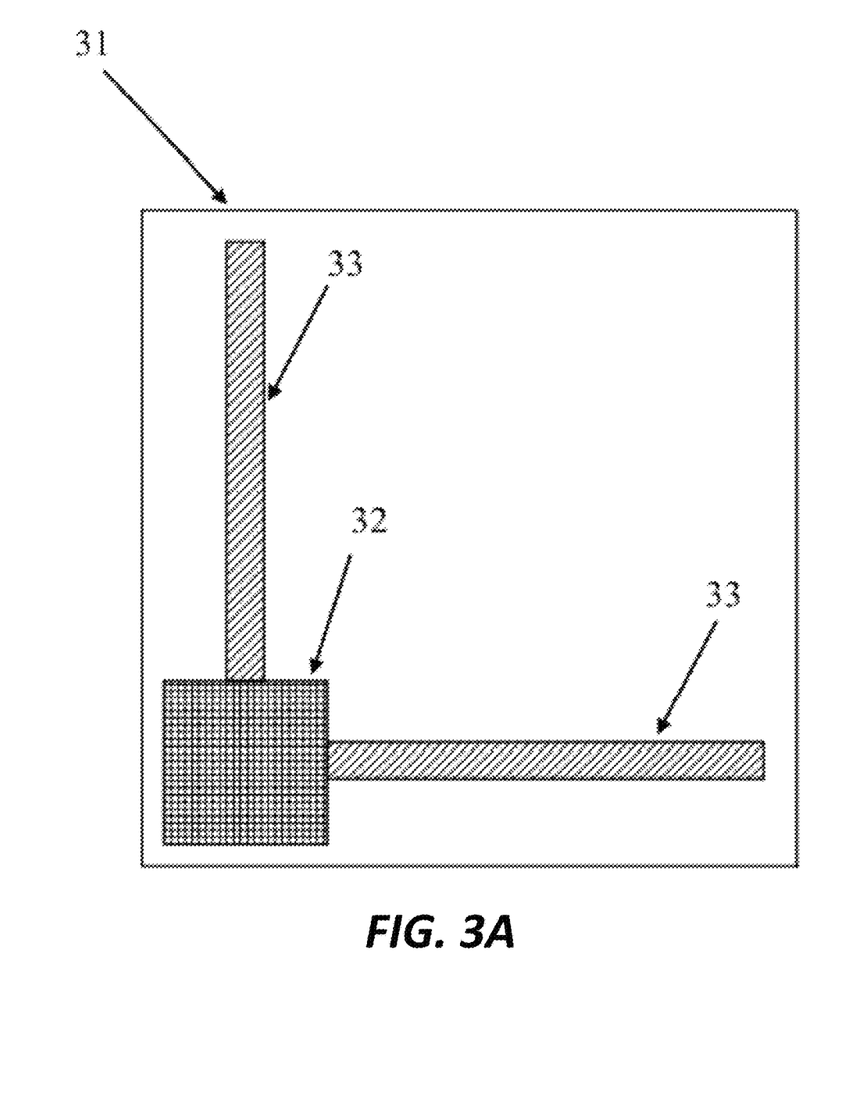
FIGS. 3A, 3B and 3C schematically illustrate an exemplary method of using a mechanical limitation for pre-stretching an electro-active polymer by a pre-determined amount in two axes.
Figure 3B:
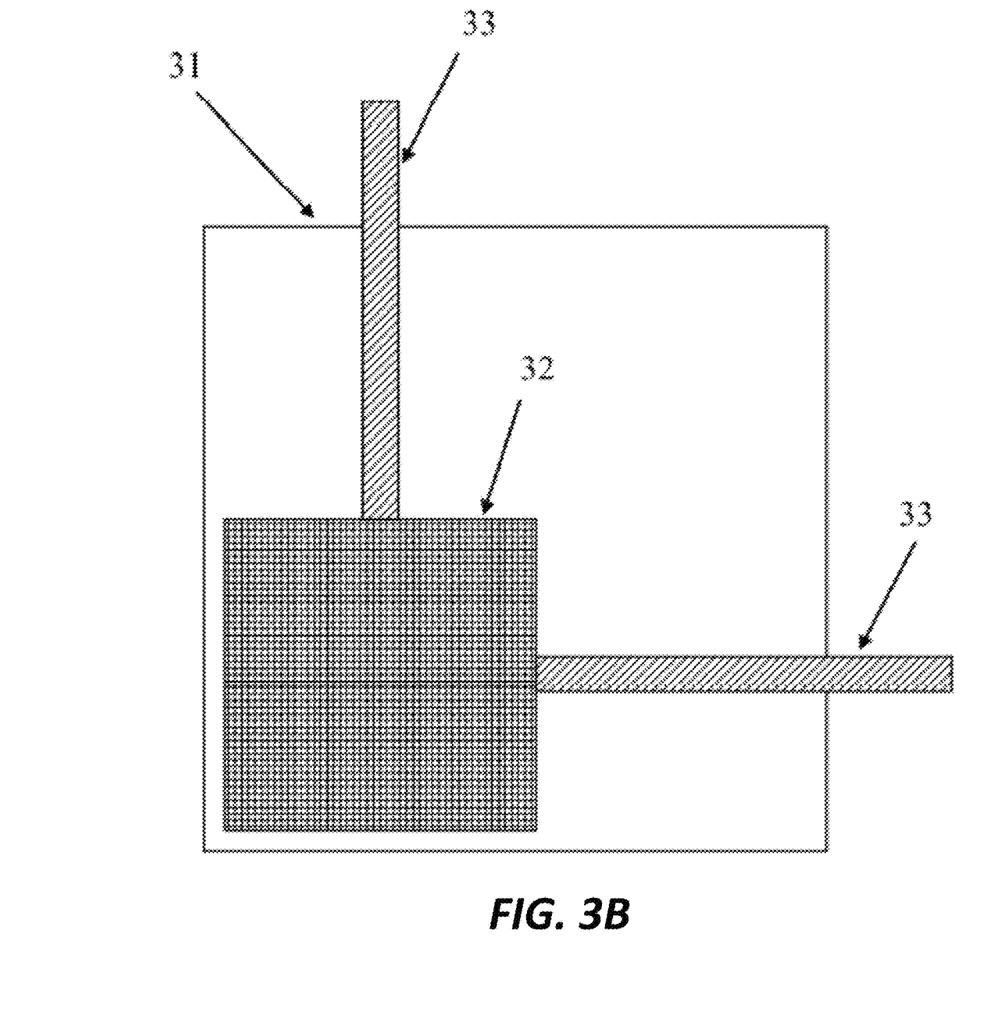
Figure 3C:
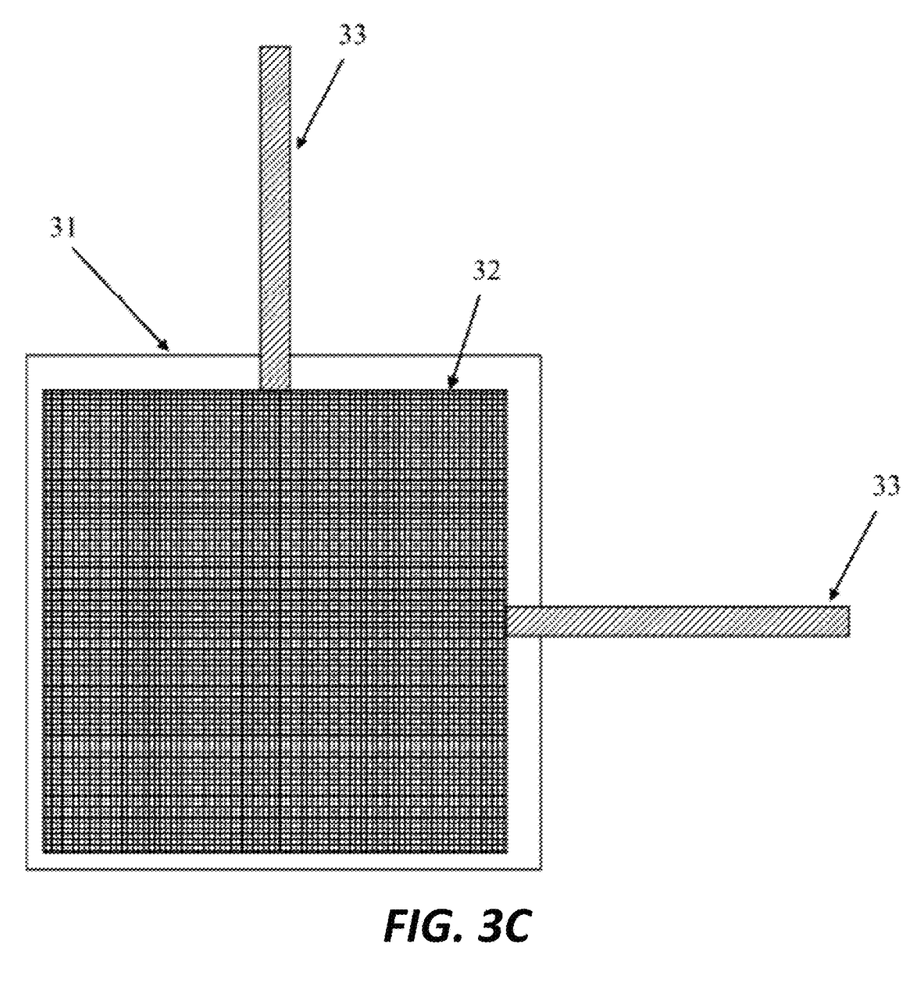

FIGS. 3A, 3B and 3C schematically illustrate an exemplary method of using a mechanical limitation for pre-stretching an electro-active polymer by a pre-determined amount in two axes. As FIG. 3A shows, the EAP film 32, is connected to two pulling straps 33 and is held within a sleeve 31. Pulling the pulling straps 33 stretches the EAP film 32, as shown in FIGS. 3B and 3C.

Figure 4:
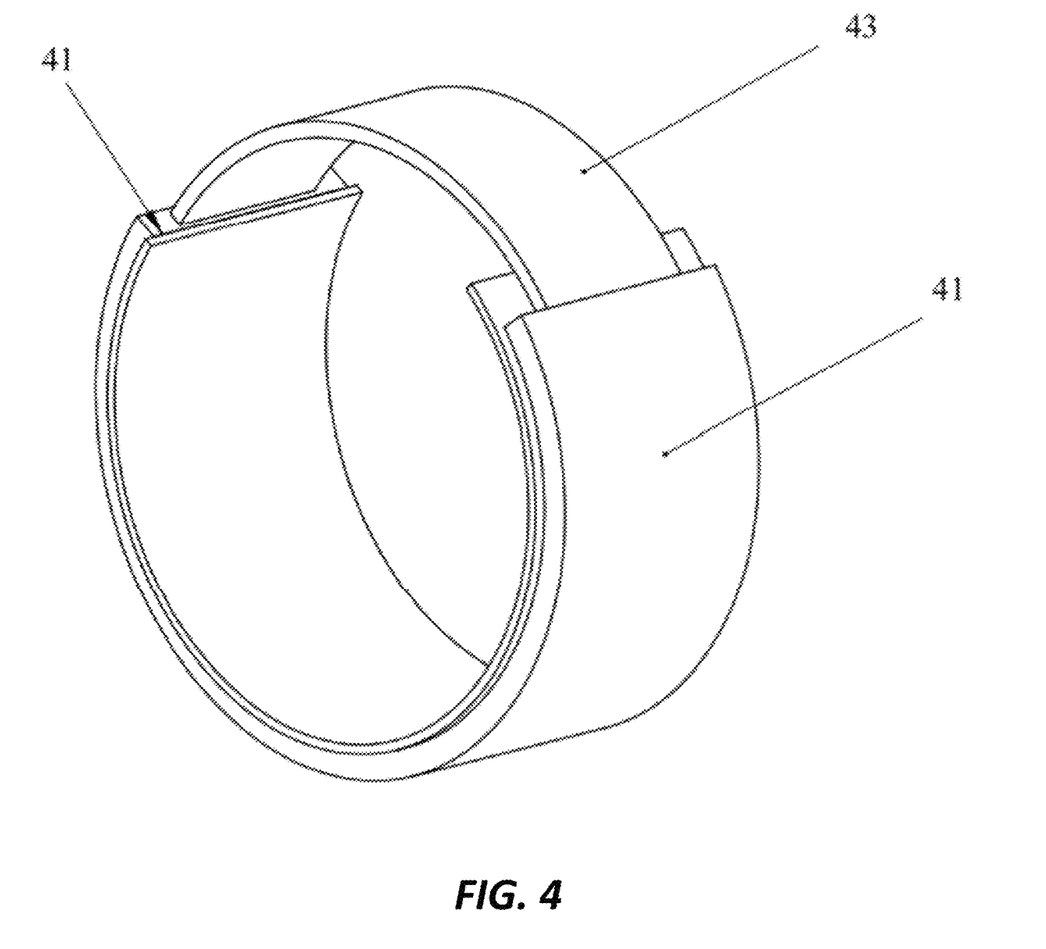
FIG. 4 schematically illustrates an exemplary method of fixing a pre-stretched electro-active polymer by wrapping it around a solid body

FIG. 4 schematically illustrates an exemplary method of fixing a pre-stretched electro-active polymer by wrapping it around a solid body. As FIG. 4 shows, the sleeve 41 is wrapped around a solid body. The sleeve 41 is fixed in place by connecting the pulling straps 43 to the sleeve 41.

Figure 5A:
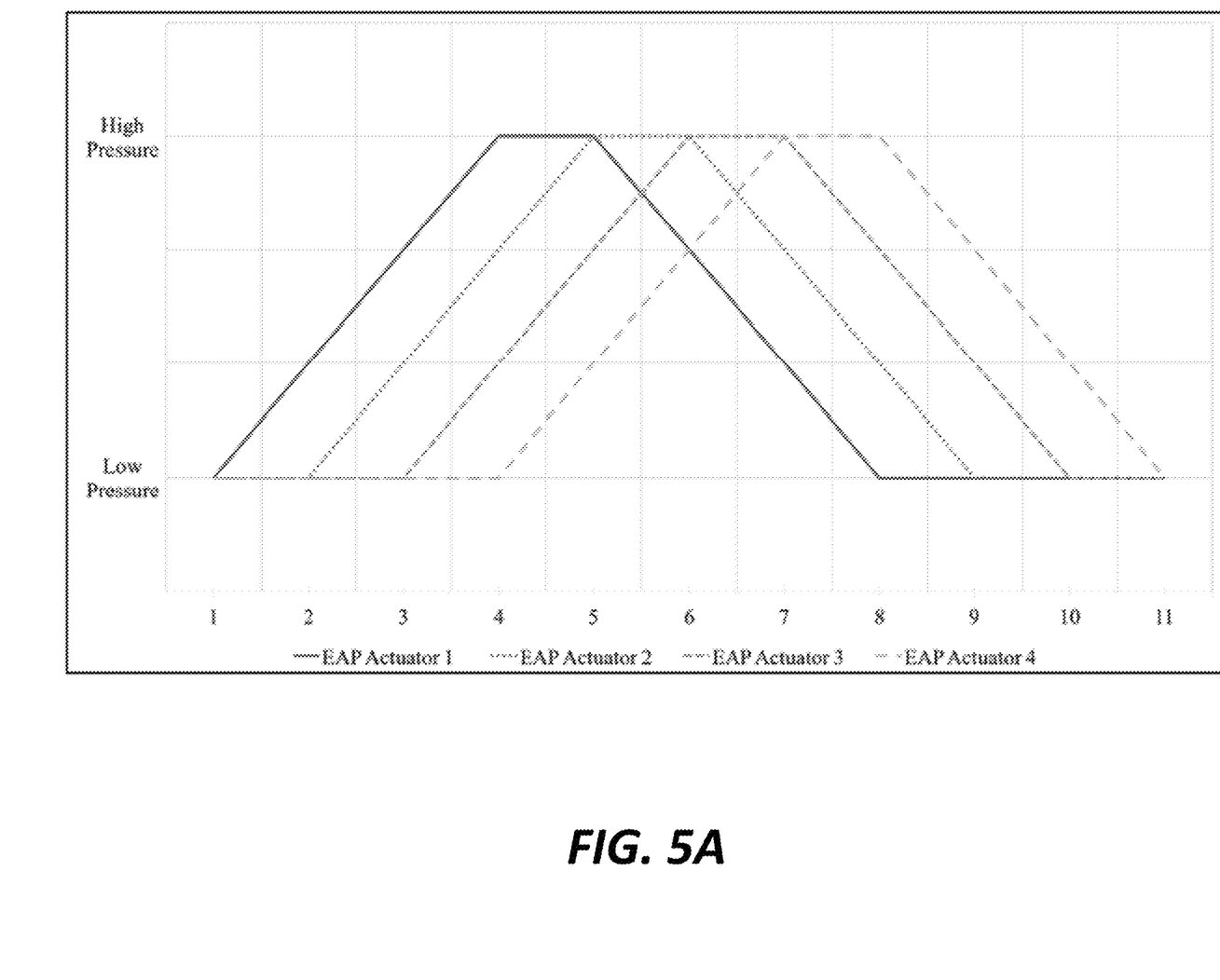
FIGS. 5A, 5B, 5C and 5D are charts which generally illustrates an exemplary procedure of sequential and intermittent compression applied by 4 EAP actuators.
Figure 5B:
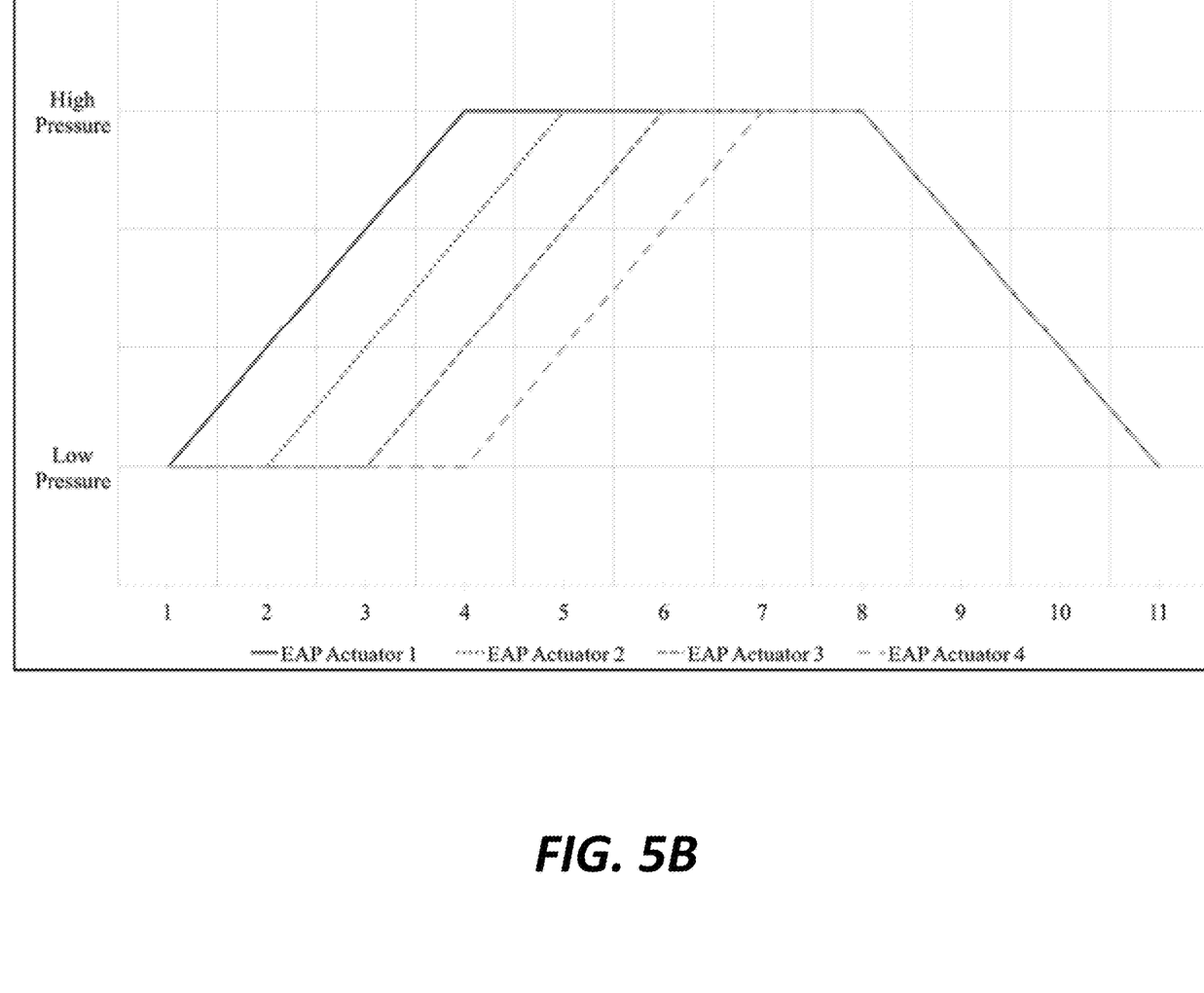
Figure 5C:
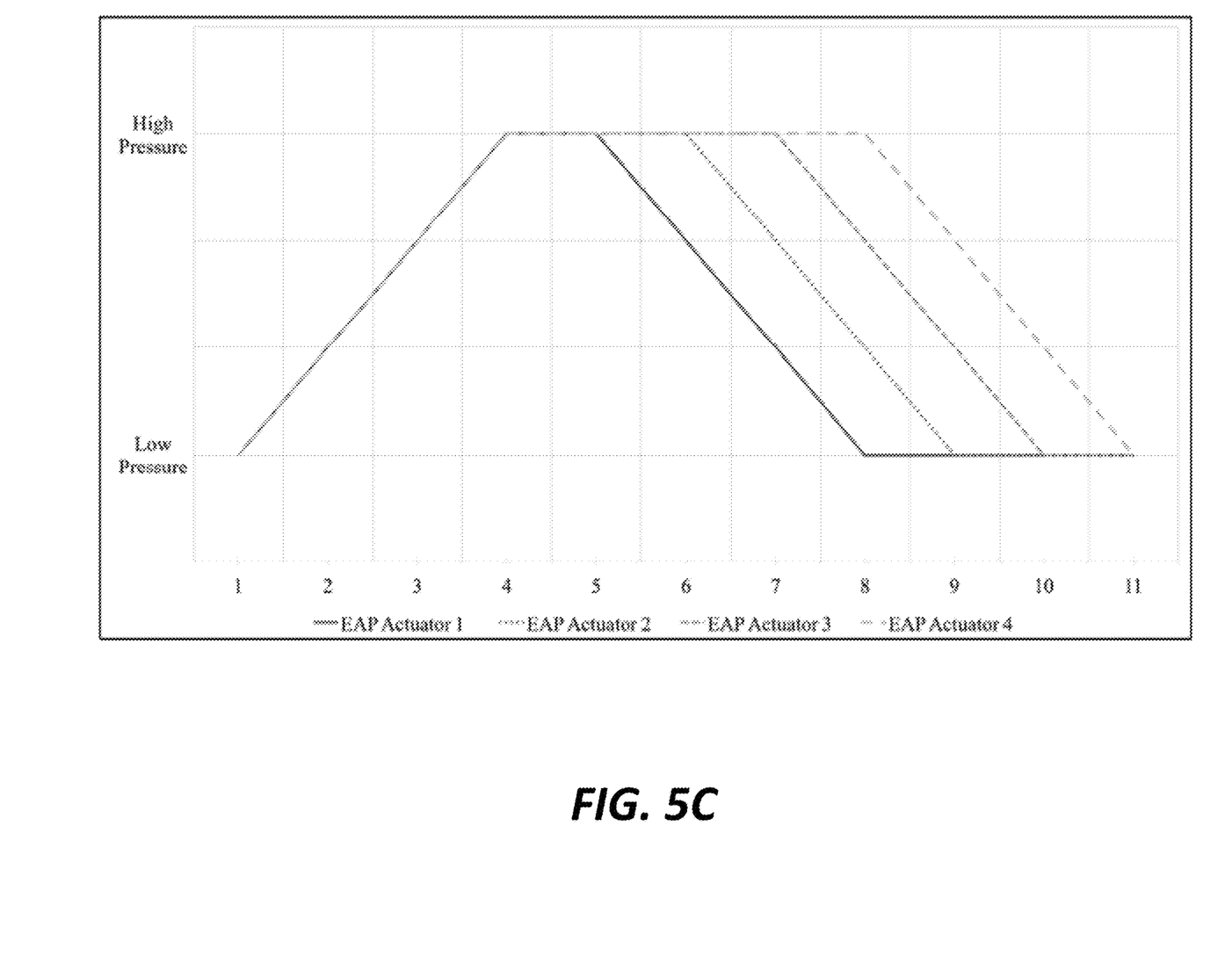
Figure 5D:
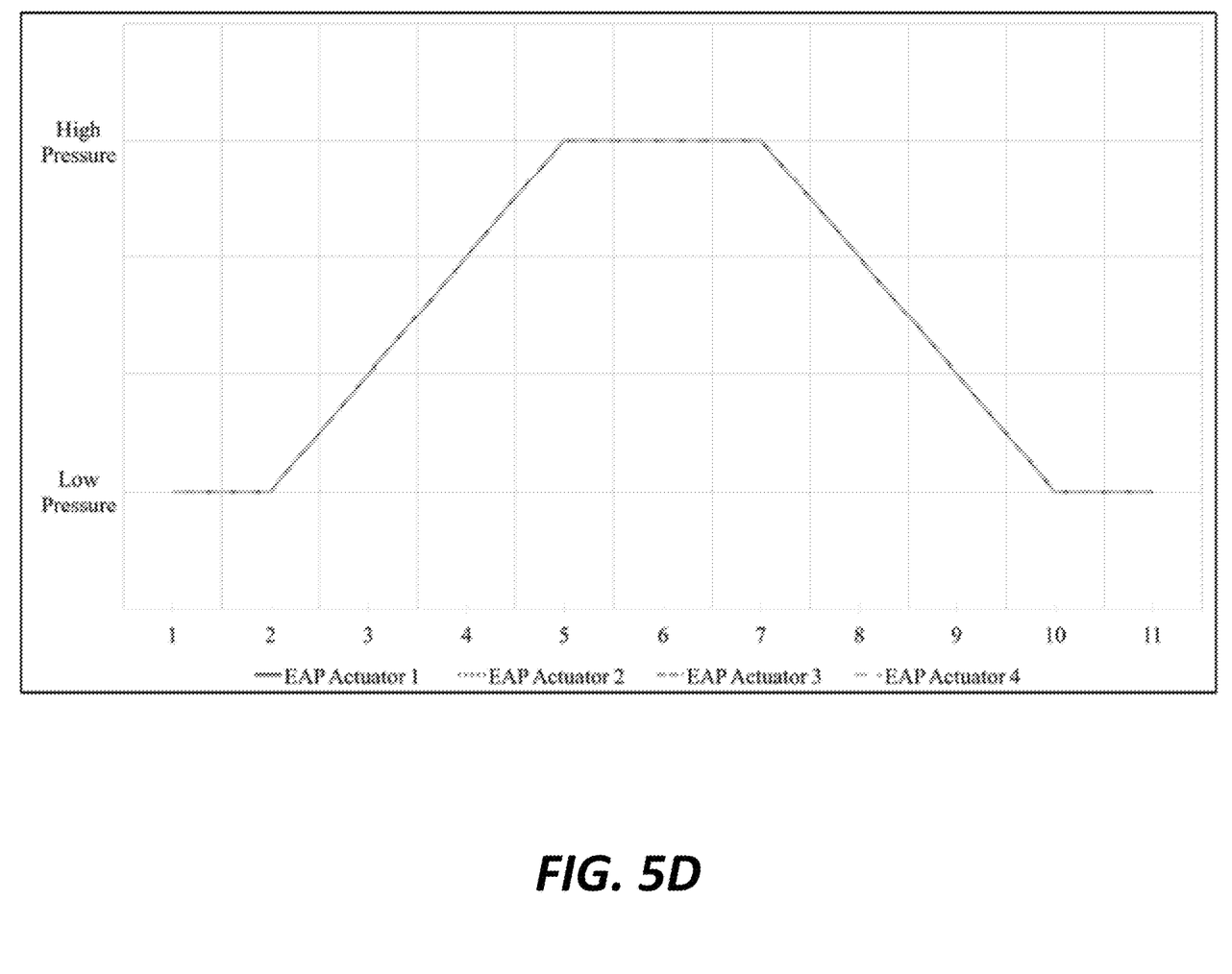

FIGS. 5A, 5B and 5C are charts which generally illustrate an exemplary procedure of applying sequential compression by 4 EAP actuators, in which the 4 EAP actuators are wrapped in parallel along the solid body and the high pressure is being applied sequentially. FIG. 5D is a chart which generally illustrates an exemplary procedure of applying intermittent compression applied by 4 EAP actuators, in which the 4 EAP actuators are wrapped in parallel along the solid body and the high pressure is being applied intermittently by the 4 EAP actuators.

In some embodiments, the present invention is directed to an exemplary inventive method that at least includes steps of: providing at least one housing having a pre-determined physical structure; fixing a first edge of at least one electro-active polymer (EAP) film within the at least one housing; connecting a first edge of at least one pulling mechanism to a second edge of the at least one EAP film; where the first edge and the second edge of the at least one EAP film are opposite of each other; where a second edge of the at least one pulling mechanism extends outside of the at least one housing; sufficiently pulling at the second edge of the at least one pulling mechanism to form at least one pre-stretched EAP film that has been stretched in a first axial direction within the at least one housing by a first pre-determined, pre-stretched amount; and where the pre-determined, pre-stretched amount is limited by the pre-determined physical structure of the housing.

In some embodiments, the exemplary inventive method may further include utilizing at least one first attachment mechanism to fix the first edge of the at least one EAP film to a first edge of the at least one housing; and utilizing at least one second attachment mechanism to fix the second edge of the at least one EAP film to the at least one pulling mechanism.

In some embodiments, the at least one first attachment mechanism and the at least one second attachment mechanism are clips.

In some embodiments, the at least one housing is a flexible sleeve.

In some embodiments, the exemplary inventive method may further include wrapping the at least one housing with the at least one pre-stretched EAP film around a solid body, and securing the at least one housing on the solid body.

In some embodiments, the solid body is at least a portion of a part of a human or animal body.

In some embodiments, the exemplary inventive method may further include securing of the flexible sleeve on the solid body by connecting the at least one second attachment mechanism to at least one of: the at least one first attachment mechanism or the at least one housing.

In some embodiments, the wrapping the flexible sleeve with the at least one pre-stretched EAP film around the solid body is configured to apply a particular pressure to the solid body.

In some embodiments, the exemplary inventive method may further include activating the at least one pre-stretched EAP film to reduce the particular pressure on the solid body to a particular reduced pressure.

In some embodiments, the exemplary inventive method may further include deactivating the at least one pre-stretched EAP film to raise the particular reduced pressure.

In some embodiments, a X number of pre-stretched EAP films are associated with one or more housings, where X is between 1 and 10,000.

In some embodiments, the exemplary inventive method may further include subjecting, during a particular time period, one or more first EAP films to at least one condition selected from: i) activation or ii) deactivation; and subjecting, during the particular time period, one or more second EAP films to the at least one condition; and where the subjecting the one or more first EAP films to the at least one condition and the subjecting the one or more second EAP films to the at least one condition are performed with respect to each other i) sequentially or ii) intermittently.

In some embodiments, the exemplary inventive method may further include connecting a first edge of at least one second pulling mechanism to a third edge of the at least one EAP film; where the first edge, the second edge, and the third edge of the at least one EAP film are distinct edges; where a second edge of the at least one second pulling mechanism extends outside of the at least one housing; sufficiently pulling at the second edge of the at least one second pulling mechanism to stretch the at least one EAP film in a second axial direction within the at least one housing by a second pre-determined, pre-stretched amount to form at least one biaxially pre-stretched EAP film; where the second pre-determined, pre-stretched amount is also limited by the pre-determined physical structure of the housing.

In some embodiments, the present invention is directed to an exemplary active compression device that may include at least the following components of: at least one housing having a pre-determined physical structure; at least one electro-active polymer (EAP) film having a first edge that is fixed within the at least one housing; at least one pulling mechanism that is connected to a first edge of to a second edge of the at least one EAP film; where the first edge and the second edge of the at least one EAP film are opposite of each other; where a second edge of the at least one pulling mechanism extends outside of the at least one housing; where the the at least one pulling mechanism is configured to allow sufficient pulling at the second edge of the at least one pulling mechanism to form at least one pre-stretched EAP film that has been stretched in a first axial direction within the at least one housing by a first pre-determined, pre-stretched amount; and where the pre-determined, pre-stretched amount is limited by the pre-determined physical structure of the housing.

While a number of embodiments of the present invention have been described, it is understood that these embodiments are illustrative only, and not restrictive, and that many modifications may become apparent to those of ordinary skill in the art, including that various embodiments of the inventive methodologies, the inventive systems, and the inventive devices described herein can be utilized in any combination with each other. Further still, the various steps may be carried out in any desired order (and any desired steps may be added and/or any desired steps may be eliminated).

What is claimed is:
1. A method, comprising:
providing at least one housing having a pre-determined physical structure;
fixing a first edge of at least one electro-active polymer (EAP) film within the at least one housing;
connecting a first edge of at least one pulling mechanism to a second edge of the at least one EAP film;
wherein the first edge and the second edge of the at least one EAP film are opposite of each other;
wherein a second edge of the at least one pulling mechanism extends outside of the at least one housing;
sufficiently pulling at the second edge of the at least one pulling mechanism to form at least one pre-stretched EAP film that has been stretched in a first axial direc- tion within the at least one housing by a first pre-determined, pre-stretched amount; and wherein the first pre-determined, pre-stretched amount is limited by the pre-determined physical structure of the at least one housing.

2. The method of claim 1, further comprising:

utilizing at least one first attachment mechanism to fix the first edge of the at least one EAP film to a first edge of the at least one housing; and utilizing at least one second attachment mechanism to fix the second edge of the at least one EAP film to the at least one pulling mechanism.

3. The method of claim 2, wherein the at least one first attachment mechanism and the at least one second attachment mechanism are clips.

4. The method of claim 2, wherein the at least one housing is a flexible sleeve.

5. The method of claim 4, further comprising:

wrapping the at least one housing with the at least one pre-stretched EAP film around a solid body, and securing the at least one housing on the solid body.

6. The method of claim 5, wherein the solid body is at least a portion of a part of a human or animal body.

7. The method of claim 5, wherein the securing of the flexible sleeve on the solid body comprises:

connecting the at least one second attachment mechanism to at least one of:
  i) the at least one first attachment mechanism or
  ii) the at least one housing.

8. The method of claim 5, wherein the wrapping the flexible sleeve with the at least one pre-stretched EAP film around the solid body is configured to apply a particular pressure to the solid body.

9. The method of claim 8, further comprising:

activating the at least one pre-stretched EAP film to reduce the particular pressure on the solid body to a particular reduced pressure.

10. The method of claim 9, further comprising:

deactivating the at least one pre-stretched EAP film to raise the particular reduced pressure.

11. The method of claim 4, wherein an X number of pre-stretched EAP films are associated with one or more housings, wherein X is between 1 and 10,000.

12. The method of claim 11, further comprising:

subjecting, during a particular time period, one or more first EAP films to at least one condition selected from:
  i) activation or
  ii) deactivation; and subjecting, during the particular time period, one or more second EAP films to the at least one condition; and wherein the subjecting the one or more first EAP films to the at least one condition and the subjecting the one or more second EAP films to the at least one condition are performed with respect to each other
  i) sequentially or
  ii) intermittently.

13. The method of claim 1, further comprising:

connecting a first edge of at least one second pulling mechanism to a third edge of the at least one EAP film;

wherein the first edge, the second edge, and the third edge of the at least one EAP film are distinct edges;

wherein a second edge of the at least one second pulling mechanism extends outside of the at least one housing;

sufficiently pulling at the second edge of the at least one second pulling mechanism to stretch the at least one EAP film in a second axial direction within the at least one housing by a second pre-determined, pre-stretched amount to form at least one biaxially pre-stretched EAP film;

wherein the second pre-determined, pre-stretched amount is also limited by the pre-determined physical structure of the at least one housing.

14. An active compression device, comprising:

at least one housing having a pre-determined physical structure;

at least one electro-active polymer (EAP) film having a first edge that is fixed within the at least one housing;

at least one pulling mechanism that is connected to a first edge of to a second edge of the at least one EAP film;

wherein the first edge and the second edge of the at least one EAP film are opposite of each other;

wherein a second edge of the at least one pulling mechanism extends outside of the at least one housing;

wherein the at least one pulling mechanism is configured to allow sufficient pulling at the second edge of the at least one pulling mechanism to form at least one pre-stretched EAP film that has been stretched in a first axial direction within the at least one housing by a first pre-determined, pre-stretched amount; and wherein the pre-determined, pre-stretched amount is limited by the pre-determined physical structure of the at least one housing.

15. The device of claim 14, further comprising:

at least one first attachment mechanism that is configured to fix the first edge of the at least one EAP film to a first edge of the at least one housing; and at least one second attachment mechanism that is configured to fix the second edge of the at least one EAP film to the at least one pulling mechanism.

16. The device of claim 15, wherein the at least one first attachment mechanism and the at least one second attachment mechanism are clips.

17. The device of claim 15, wherein the at least one housing is a flexible sleeve.

18. The device of claim 17, wherein the at least one housing is configured to:

allow the at least one housing with the at least one pre-stretched EAP film to be wrapped around a solid body, and secure the at least one housing on the solid body.

19. The device of claim 18, wherein the solid body is at least a portion of a part of a human or animal body.

20. The device of claim 18, wherein the at least one housing with the at least one pre-stretched EAP film is configured to apply a particular pressure to the solid body.

21. The device of claim 20, wherein the device is further configured to:
  i) reduce the particular pressure on the solid body to a particular reduced pressure when the at least one pre-stretched EAP film is activated, and
  ii) raise the particular reduced pressure when the at least one pre-stretched EAP film is deactivated.

22. The device of claim 17, wherein an X number of pre-stretched EAP films are associated with one or more housings, wherein X is between 1 and 10,000.

23. The device of claim 22, wherein the device is further configured to:

subject, during a particular time period, one or more first EAP films to at least one condition selected from:
  i) activation or
  ii) deactivation; and subject, during the particular time period, one or more second EAP films to the at least one condition; and wherein the subjecting the one or more first EAP films to the at least one condition and the subjecting the one or more second EAP films to the at least one condition are performed with respect to each other
  i) sequentially or
  ii) intermittently.

24. The device of claim 14, further comprising:

at least one second pulling mechanism that is connected, at a first edge of the at least one second pulling mechanism, to a third edge of the at least one EAP film;
  wherein the first edge, the second edge, and the third edge of the at least one EAP film are distinct edges;
  wherein a second edge of the at least one second pulling mechanism extends outside of the at least one housing;
  wherein the at least one second pulling mechanism is configured to allow sufficient pulling at the second edge of the at least one second pulling mechanism to stretch the at least one EAP film in a second axial direction within the at least one housing by a second pre-determined, pre-stretched amount to form at least one biaxially pre-stretched EAP film;
  wherein the second pre-determined, pre-stretched amount is also limited by the pre-determined physical structure of the at least one housing.

* * * * *